PULSE GENERATOR
Filed Oct. 22, 1965
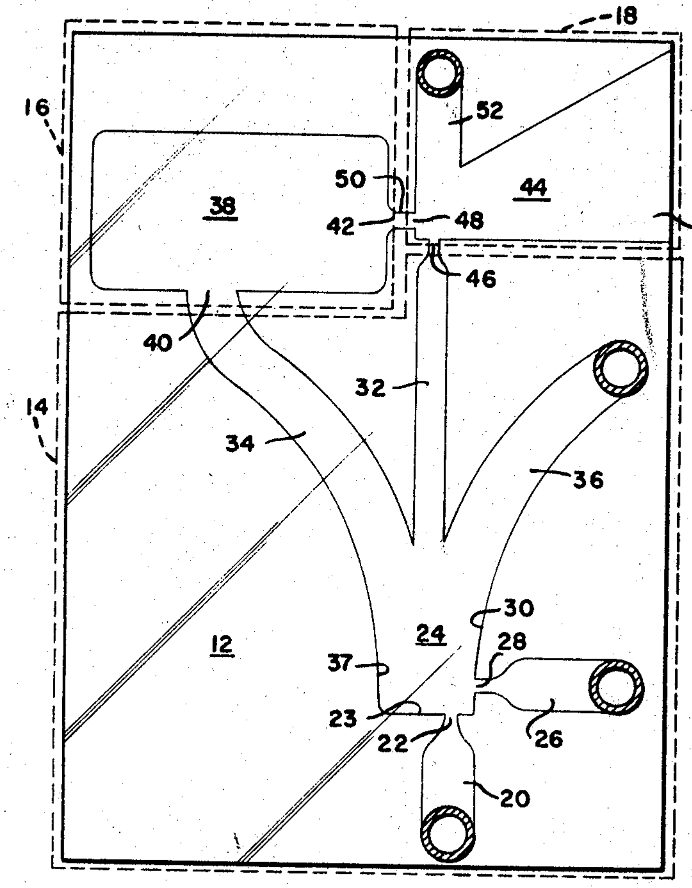
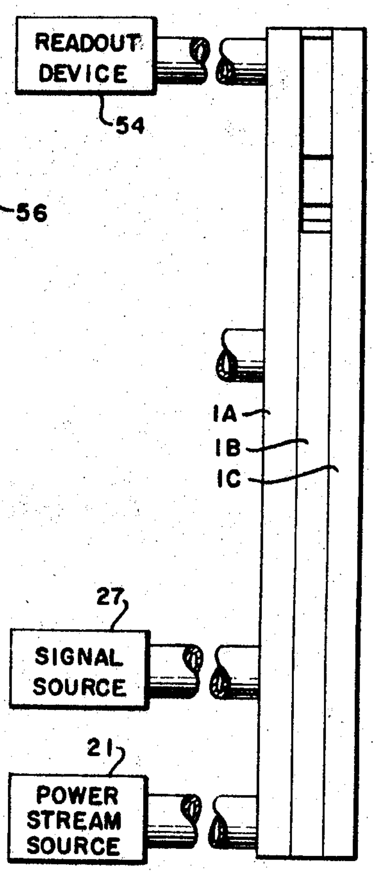
FIG. 1. FIG. 2.
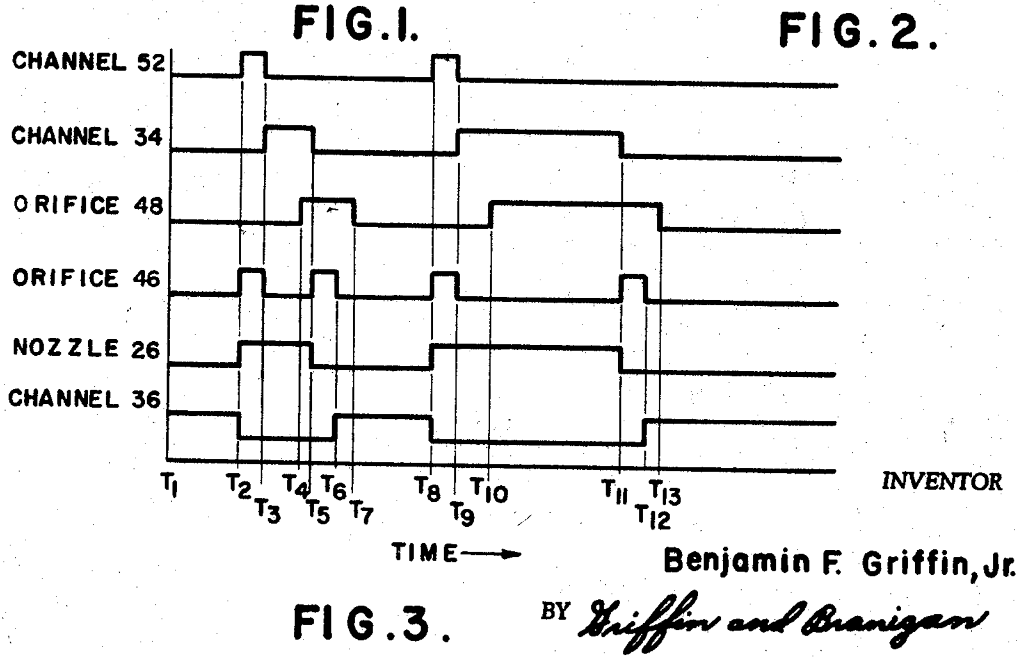
FIG. 3.
INVENTOR
Benjamin F. Griffin, Jr.
BY *Griffin and Branigan*
ATTORNEYS INVENTOR
Benjamin F. Griffin, Jr.

BY Griffin and Branigan
ATTORNEYS

INVENTOR
Benjamin F. Griffin, Jr.
BY Griffin and Branigan
ATTORNEYS

April 8, 1969 B. F. GRIFFIN, JR 3,437,099

PULSE GENERATOR

Filed Oct. 22, 1965 Sheet 4 of 4

INVENTOR

Benjamin F. Griffin, Jr.

BY Griffin and Branigan

ATTORNEYS

United States Patent Office 3,437,099
Patented Apr. 8, 1969

3,437,099
PULSE GENERATOR

Benjamin F. Griffin, Jr., Fairfax County, Va., assignor to Sperry Rand Corporation, New York, N.Y., a corporation of Delaware Filed Oct. 22, 1965, Ser. No. 502,113
Int. Cl. F15c 1/10
U.S. Cl. 137—81.5 10 Claims

ABSTRACT OF THE DISCLOSURE

A pure fluid pulse generator utilizing the structure of U.S. Patent 3,159,169 is disclosed. In the identified U.S. patent, three output channels are provided where fluid will transiently exit from a first output channel when being switched from the second output channel to the third output channel and vice versa. A pure fluid inhibit device is connected with its signal input channel to the first output channel of the patented amplifier and its inhibit input to one of the other outputs of the amplifier through a fluid signal delay path. This interconnection operates to suppress from the output of the inhibit device one of the transient signals.

The present invention relates to pulse generators and more particularly to pulse generators employing pure fluid amplifiers.

In U.S. Patent No. 3,159,169 there is disclosed a pure fluid pulse generator responsive to control signals of variable duration for producing fluid output signals of fixed duration. However, the patented device employs a fluid amplifier having three output channels with the signals of fixed duration being introduced in the first output channel as the power stream of the fluid amplifier is switched between the second and third output channels. Thus, for each control signal applied to the amplifier two output signals of fixed duration are produced in the second output channel: one when the power stream is switched from the second to the third output channel, and another when the power stream is switched from the third to the second output channel. On the other hand, it is desirable in some instances to produce a single output signal of fixed duration for each control signal of variable duration.

Therefore, an object of the present invention is to provide a pulse generator for producing a single output signal of fixed duration in response to an input control signal of variable duration.

Another object of this invention is to provide a pure fluid pulse generator comprising a fluid amplifier having a first output channel disposed between second and third output channels and a control signal input for selectively switching the power stream of the amplifier between the second and third outputs so that a portion of the power stream flows into the first output channel each time the power stream of the amplifier is switched, and a pure fluid inhibit circuit connected to the first and second output channels of the amplifier. A fluid signal delay element is interposed in the connection between the second output channel and the inhibit circuit so that an inhibit signal is present during the interval the power stream switches from the second to the third output channel. The inhibit signal inhibits the passage of the fluid signal from the first output channel so that it does not reach the output of the inhibit circuit.

A further object of this invention is to provide an analog to digital converter employing a pulse generator as described above for generating a number of fluid digital pulses proportional to the magnitude of an analog input signal. The pulse generator is modified to make the fluid signal delay element capable of delaying a fluid signal for a time proportional to an analog input signal. The pulse generator is further modified by providing a plurality of parallel paths of fluid flow, each path having a fluid delay element of a different value associated therewith. The paths are connected in a parallel circuit arrangement between the first output channel of the fluid amplifier and the signal input of the inhibit circuit so that a plurality of pulses are applied to the signal input of the inhibit circuit each time the power stream switches from the second to the third output channel thereby flowing momentarily into the first output channel. The number of pulses passing through the inhibit circuit to the output of the converter is dependent upon how long an inhibit signal is applied to the inhibit circuit after the power stream switches away from the second output channel. Since this is determined by the variable delay controlled by the analog input signal it follows that the number of output pulses produced is also proportional to the magnitude of the analog input signal.

Other objects and features of the invention will become apparent to those skilled in the art by reference to the following detailed description when considered in conjunction with the figures of the drawings wherein:

FIG. 1 is a plan view of a pulse generator of one embodiment of the invention;

FIG. 2 is a side view of the embodiment of FIG. 1;

FIG. 3 is a timing chart of the operation of the embodiment of FIG. 1;

Figure 4:
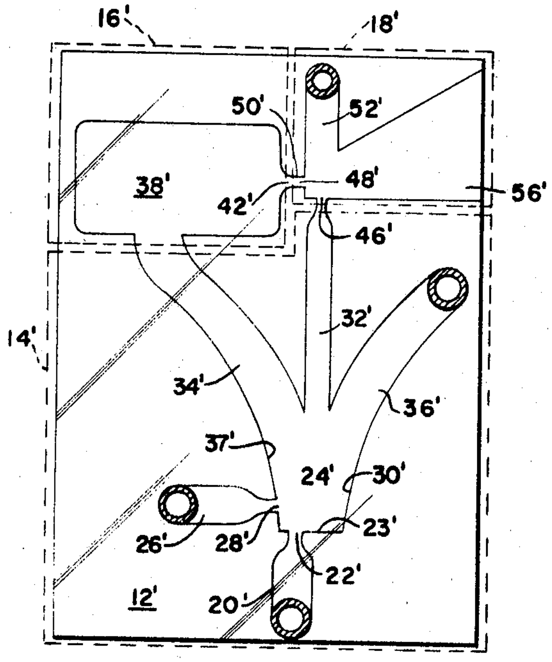
FIG. 4 is a plan view of another embodiment of the invention.

The first embodiment of the invention is illustrated in FIGS. 1 and 2 and comprises a fluid amplifier pulse generator generally designated 12. Pulse generator 12 is constructed of three plates 1A, 1B, and 1C which are formed of any suitable material such as plastic, metal or any other material of sufficient rigidity which is impervious to liquids or gases. The central plate 1B has portions removed therefrom so as to form chambers and passageways such as 24, 32, etc. therein. Plates 1A and 1C are cemented or bonded in any conventional manner to opposite sides of plate 1B so as to form top and bottom walls for the various chambers and passageways. This form of construction is a conventional manner of assembling fluid circuits and is given by way of example only. Other modes of construction are equally suitable in implementing the invention.

Pulse generator 12 comprises three fluid circuit components which are outlined by the dashed lines in FIG. 1. The three components of pulse generator 12 are monostable fluid amplifier 14, time delay circuit 16 and inhibit circuit 18.

Monostable fluid amplifier 14 comprises a power stream nozzle 20 having an inlet connected to a conventional power stream source 21 and a discharge orifice 22 in a first wall 23 of an interaction chamber 24, a control nozzle 26 for receiving fluid pulse signals from an intermittently operable signal source 27 with control nozzle 26 having a discharge orifice 28 in a right wall 30 of chamber 24 and first, second and third output channels 32, 34, and 36, respectively. A left wall 37 of chamber 34 is spaced further from orifice 22 that is right wall 30 so that flow from power stream orifice 22 tends to lock on to wall 30 in well known manner and egress from chamber 24 via channel 36 which is an exhaust channel which discharges to the atmosphere or to a supply sump for source 21.

Time delay circuit 16 comprises any conventional form of fluid delay means such as a chamber or fluid capacitance delay means 38. Delay means 38 has an input orifice 40 for receiving flow from second channel 34 and an output orifice 42 connected to inhibit circuit 18.

Inhibit circuit 18 has an interaction chamber 44 with a signal input orifice 46 on one wall thereof for receiving flow from first channel 32, which serves as a signal input channel for inhibit circuit 18, and an inhibit orifice 48 connected to orifice 42 by means of inhibit channel 50. A first or signal output channel 52 is connected to a readout device 54 which may be any conventional means capable of being actuated by a fluid pulse. A second discharge or exhaust channel 56 is open to the atmosphere or may be connected back to the power stream source sump.

During the stable state of amplifier 14 the power stream is locked on to wall 30 and exhausts through channel 36. The power stream continues to flow through channel 36 until signal source 27 is actuated so as to cause control nozzle 26 to inject a control jet into chamber 24 via orifice 28 with sufficient force to switch the power stream to the second output channel 34. During the switching action the power stream swings across the upstream extent of first output channel 32 so as to cause a first fluid pulse to flow into channel 32. This pulse flows through channel 32, orifice 46, and out channel 52 into the readout device 54. The power stream continues to flow through channel 34 as long as the control signal is being injected by nozzle 26. The left wall 37 of chamber 24 is spaced far enough to the left of nozzle 20, as viewed in FIG. 1, so as to prevent the power stream from locking on to wall 37. Consequently, the power stream will begin switching back to the third output channel 36 immediately upon termination of the control signal from nozzle 26. The power stream again injects a second fluid pulse into channel 20 as it switches back to channel 36. However, this second pulse does not enter channel 52 so as to be read by readout means 54 for reasons to become apparent hereinafter.

In actual practice there is an inherent delay in transmitting a fluid pulse from one point to another along a fluid passage. However, for the sake of clarity in the following description it will be assumed that these inherent delays do not exist or are so slight as to be negligible.

The manner in which inhibit circuit 18 serves to block the second pulse from orifice 46 cause by the return of the power stream from channel 34 to channel 36 will now be discussed with reference to FIG. 1. During the time that control nozzle 26 is actuated the power stream flows into channel 34 and exits therefrom into delay means 38. After a given time interval, as determined by the delay characteristic of delay means 38, the power stream will begin to flow through orifice 42, channel 50 and orifice 48. The delay period for means 38 must be greater than the duration of the pulse from orifice 46 for reasons that will become obvious from the following discussion. In a similar manner, for reasons which will become apparent, the control impulse through orifice 28 must be of such duration that it does not terminate prior to the beginning of flow from orifice 48. The flow from orifice 48 will deflect any flow from orifice 46 so that the combined outputs of orifice 46 and orifice 48 will be exhausted through channel 56. Flow from nozzle 48 continues for a time period, equal to the time delay period of delay means 38, after the power stream stops flowing into channel 34. Accordingly, when the power stream shifts from channel 34 to channel 36 to the pulse from nozzle 46 created by the shift is deflected by the jet from orifice 48 which continues to flow until a time after flow from orifice 46 has terminated.

The manner in which the embodiment of the invention illustrated in FIG. 1 functions will be better understood with reference to the timing chart of FIG. 3 of the drawings. The pulse wave forms represented in FIG. 3 have been idealized so as to provide a clearer indication of the manner in which the device functions. Assume, at time $T_1$, that there is a stable state of flow in amplifier 14 and control channel 36 has a continuing output. The injection of a control signal pulse through nozzle 26 at time $T_2$ immediately terminates flow through channel 36, and since the power stream is switched quite rapidly, a pulse immediately begins through channel 32 and orifice 46 since channel 32 has a negligible delay. Since the power stream is rapidly shifted from channel 36 to channel 34, the duration of the pulse from orifice 46 is fairly short and said pulse terminates at time $T_3$ as illustrated in FIG. 3. Flow begins in channel 34 as soon as the power stream is switched past channel 32. However, delay means 38 prevents this flow from issuing from orifice 48 until time $T_4$. Assuming that the control pulse to nozzle 26 is terminated at time $T_5$, a second pulse is generated from orifice 46 as the power stream swings past channel 32 back to channel 36. Since the flow from orifice 50 continues for a given time period after flow is terminated in channel 32, the second pulse from orifice 46 collides with the flow from orifice 48 and is deflected out exhaust channel 56. This time period during which flow continues from orifice 48 is determined by the delay characteristic of delay means 38 and such is constructed so that flow from orifice 48 terminates after the termination of flow from orifice 46 as shown in FIG. 3.

In summation, a pulse signal from nozzle 26 switches the power stream from channel 36 to channel 34 and as the power stream swings counterclockwise past channel 32 it creates a first pulse from orifice 46 which enters channel 52 to be read by the readout means 54. Flow through channel 34 and delay means 38 is delayed for a given time interval and continues to flow for this time interval after termination of the control signal from nozzle 26. During the switching of the power stream from channel 34 to channel 36 a second pulse is created through orifice 46. The continued flow from orifice 50 serves to deflect this second pulse out exhaust channel 56 and only a single pulse (i.e., the first pulse) is passed from orifice 46 to the readout means for each pulse through nozzle 26.

It is, accordingly, obvious from inspection of FIG. 3 that control pulse signals of varying duration greater than a set minimum duration produce output signals of equal duration regardless of the length of duration of the control signal. The only limitation is that the control signal must be of a duration greater than the time required for flow to switch from channel 36 to begin flow from orifice 48. In other words, the control signal through nozzle 26 must last longer than $T_4-T_2$.

The embodiment illustrated in FIG. 4 functions in a manner similar to that of the first embodiment discussed previously. In the embodiment of FIG. 4 the same numerals used in FIG. 1 are primed to designate equivalent elements.

The primary distinctions of the embodiment of FIG. 4 from the embodiment of FIGS. 1 and 2 is that the amplifier is normally biased to flow through the delay means, and the control nozzle is located so as to deflect the power stream to the exhaust channel. In all other ways the structure is identical with the first embodiment. These distinctions provide for a readout signal at the termination of a control pulse rather than the beginning of a control pulse.

The second embodiment comprises a fluid amplifier 14′, time delay circuit 16′ and an inhibit circuit 18′. The last two circuits are identical with the equivalent circuits in FIG. 1. The fluid amplifier 12′ has a power stream nozzle 20′ feeding into an interaction chamber 24′ by means of orifice 22′. Wall 37′ of interaction chamber 24′ is closer to the power stream than is wall 30′ and, consequently, fluid flow from nozzle 20′ normally locks onto wall 37′ as a result of the well known boundary layer effect. During the normal flow state of the pulse generator the power stream flows out channel 34′ into delay means 38′ and from delay means 38′ out orifice 42′, channel 50′ and orifice 48′ into inhibit circuit 18′ to be exhausted via channel 56′. Actuation of control nozzle 26′ produces a fluid pulse signal from orifice 28′ which swings the power stream across signal input channel 32′ to a position where the power stream flows out channel 36′. During the swinging movement of the power stream a first short pulse is conveyed through signal input channel 32′ and orifice 46′ to inhibit circuit 18′. However, the output from delay means 38′ is still flowing through orifice 48′ at this time and this output serves to deflect the jet from orifice 46′ into inhibit output or exhaust channel 56′. Consequently, the readout device will not receive a pulse via signal output channel 52′. Upon termination of the pulse signal from orifice 28′ the power stream switches back to channel 34′.

The delay period of delay means 38′ is such that flow from orifice 48′ continues until a short time after the first impulse from orifice 46′ has terminated. The control pulse from nozzle 26′ must be of sufficient duration so as to terminate after the termination of flow from orifice 48′. During the switching back operation the power stream again crosses channel 32′ and a second pulse flows from orifice 46′ and since the flow from orifice 48′ has terminated at this time, the second pulse from orifice 46′ is not deflected and exits through channel 52′ to be detected by the readout device.

Figure 5:
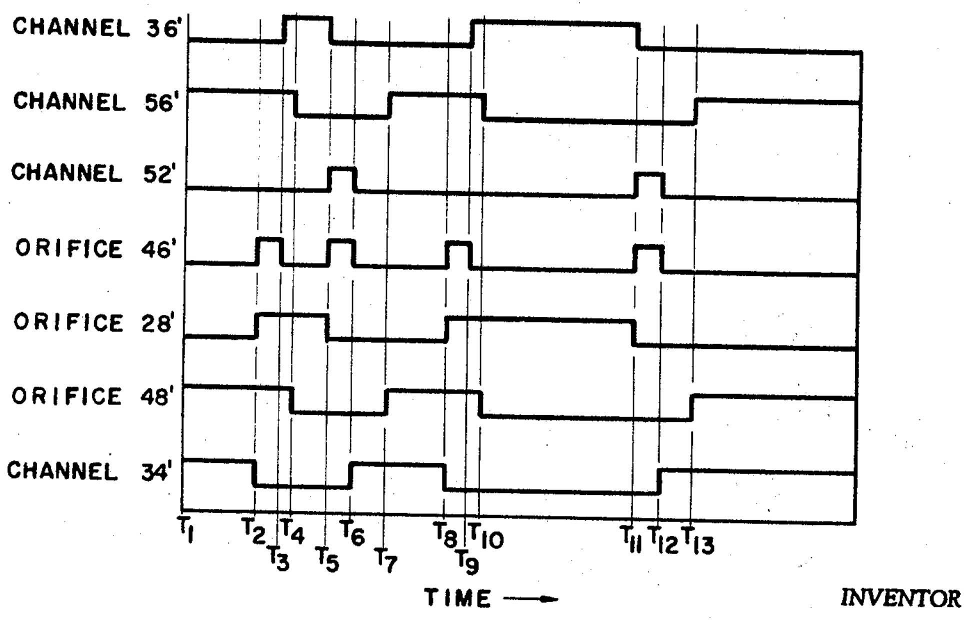
FIG. 5 is a timing chart illustrating the operation of the embodiment of FIG. 4.

Two complete cycles of operation of the device of FIG. 4 are illustrated in the timing chart of FIG. 5 which is considered to be self explanatory in view of the foregoing remarks.

Figure 6:
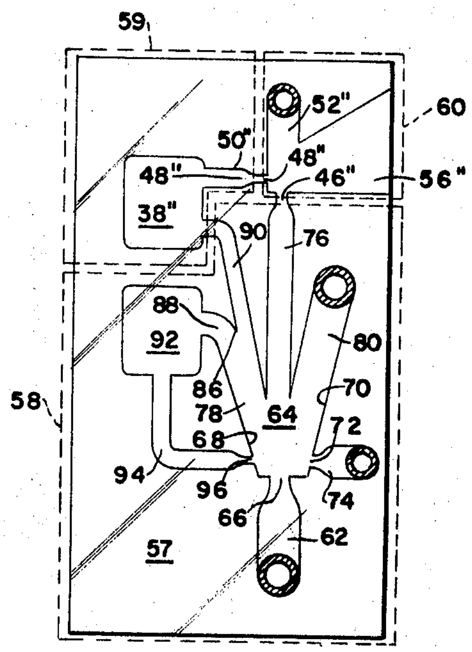
FIG. 6 is a plan view of another embodiment of the invention.

A third embodiment of the invention is illustrated in FIG. 6. This embodiment is constructed so that control signals of short and possibly varying, duration may be employed so as to provide an output signal of constant duration. This is advantageous over the previous embodiments, both of which require control signals having a minimum duration, as discussed previously.

The embodiment of FIG. 6 is constructed in the same general manner as the previous embodiments and comprises three plates fastened together with fluid channels formed in the control plate. A fluid amplifier pulse generator is generally designated 57 and includes an amplifier circuit 58, a delay circuit 59 and an inhibit circuit 60.

The amplifier circuit includes a conventional power stream nozzle 62 which connects with an interaction chamber 64 by means of an orifice 66. Interaction chamber 64 has a left wall 68 and a right wall 70 which are equally spaced from the axis of nozzle 62. The right wall 70 has a control nozzle orifice 72 of a control nozzle 74 therein. Control nozzle 74 is connected in any suitable manner to a conventional signal source which supplies signal pulses thereto. A first output channel 76, a second output channel 78, and a third output channel 80 form output paths from interaction chamber 64. The first output channel 76 discharges into inhibit circuit 60 and serves as a signal input channel therefor; the second output channel 78 is divided at 86 into channels 88 and 90. The downstream end of channel 88 leads into a first fixed delay means 92 of predetermined value. Channel 90 connects with delay circuit 59. A feedback conduit 94 connects the discharge of the delay means 92 with left wall 68 of interaction chamber 64 by means of orifice 96.

The delay circuit 59 and inhibit circuit 60 are essentially identical to the same respective circuits (16′ and 18′) illustrated in the FIG. 4 embodiment. The same designators used for the elements of said circuits in FIG. 4 have been used in FIG. 5 for the same elements with a double prime (″) thereon.

In operation, a power stream jet is injected by means of nozzle 62 into interaction chamber 64 and the power stream flow from nozzle 62 is bistable in that it attaches to either wall 68 or 70 and tends to remain attached to either of said walls through the well known boundary layer effect.

By way of illustration, assume that the power stream is flowing and is attached to wall 70 so as to flow through channel 80. This is the reset state of the device. When a signal pulse is introduced through nozzle 74 the power stream switches from channel 80 to channel 78 and in so switching crosses signal input channel 76 to create a pulse from orifice 46″. The power stream flowing through channel 78 is divided at divider 86 and the portion that enters channel 88 is fed back through first delay means 92, conduit 94 and feedback orifice 96 to chamber 64. Even if the control signal has not terminated at the time that flow begins from feedback orifice 96 the flow from feedback orifice 96 is of sufficient magnitude so as to deflect the power stream back so as to flow through output channel 80. The power stream will also obviously be deflected to channel 80 by feedback orifice 96 if the input signal from control nozzle 74 should be terminated prior to the beginning of the feedback signal from orifice 96.

That portion of the flow through channel 78 which enters channel 90 is fed through delay means 38″, inhibit input channel 50″ and orifice 48″ to inhibit circuit 60. Inhibit circuit 60 functions in exactly the same manner as the inhibit circuits of the previous embodiments. It will, accordingly, be seen that the initial switching of the power stream from channel 80 to channel 78 produces an impulse from orifice 46″ which enters channel 52″ since there is no flow through orifice 48″ at this time. The flow through channel 52″ is read by readout device in known manner. After the power stream has been established in channel 78 flow continues therethrough until a feedback signal from orifice 96 is applied to the interaction chamber 64. The switching back of the power stream from channel 78 to channel 80 creates a second impulse from orifice 46″ but this second impulse will not be read by the readout device since it will be deflected by the flow from orifice 48″ which continues for a given time period after termination of flow in channel 78. Orifice 48″ functions in the same manner as orifice 48 of the first embodiment and when flow is from orifice 48″ it serves to deflect any stream issuing from orifice 46″ into exhaust channel 56″.

In order for the device of the embodiment of FIG. 6 to function properly so as to provide only one output through channel 52″ to be read by the readout device, it is obviously necessary that the time delay period of the delay means 92 be greater than the time delay period of the delay means 38″ so that flow through orifice 48″ will be established when the power stream switches back to channel 80 and creates a second pulse through orifice 46″. Otherwise, the readout device will receive two pulses for every pulse of the control nozzle 74.

From the foregoing comments it will be readily apparent that the primary difference between the embodiment of FIG. 6 and the prior embodiments resides in the feedback manner in which the power stream is shifted back to its stable position.

Figure 7:
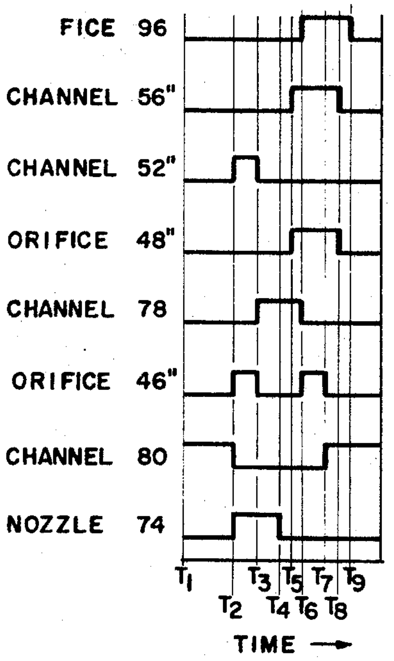
FIG. 7 is a timing chart illustrating the operation of the embodiment of FIG. 6.

The manner in which the embodiment illustrated in FIG. 6 functions will be better understood with reference to FIG. 7 which illustrates a complete cycle in the operation of the device. Assuming that the device is in its stable state at time $T_1$ there is a continuous output through channel 80. A control pulse introduced by nozzle 74 at time $T_2$ terminates the output through channel 80 and the power stream swings to the left so as to begin flowing into channel 78. During this swinging movement to channel 78 the power stream crosses channel 76 so as to cause a pulse from orifice 46″ at time $T_2$. At time $T_3$ the output from orifice 46″ terminates and flow begins in channel 78. During the time from $T_2$ to $T_3$ the flow from orifice 46″ is directed into channel 52″ so as to be read by the readout means. At time $T_4$ the control signal from nozzle 74 terminates, however, the flow of the power stream through channel 78 continues since the power stream tends to remain in channel 78 until a positive signal is received from feedback orifice 96. The delay means 38″ has a time delay period of 1.5 time units and, accordingly, flow from orifice 48″ begins at time $T_5$. The flow from orifice 48″ continues for the same length of time as the power stream flows into channel 78. The time delay period of delay means 92 is two time units and nozzle 96 is, accordingly, activated at time $T_6$. The activation of orifice 96 serves to immediately begin shifting the power stream back to channel 80 and in so shifting the power stream crosses channel 76 so as to produce a second pulse through orifice 46″. This pulse through orifice 46″ lasts from time $T_6$ to time $T_7$, however, during this time interval a pulse from orifice 48″ continues to flow and this second pulse from orifice 46″ is deflected to exhaust channel 56″ and there is no readout of a signal by the readout means. At time $T_8$ flow from nozzle 96 terminates and the device is in its original stable state.

Figure 8:
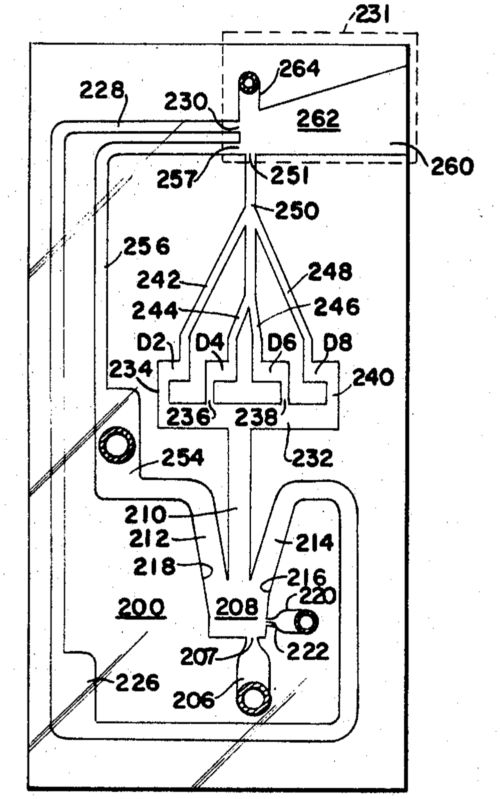
FIG. 8 is a plan view of another embodiment of the invention.
Figure 9:
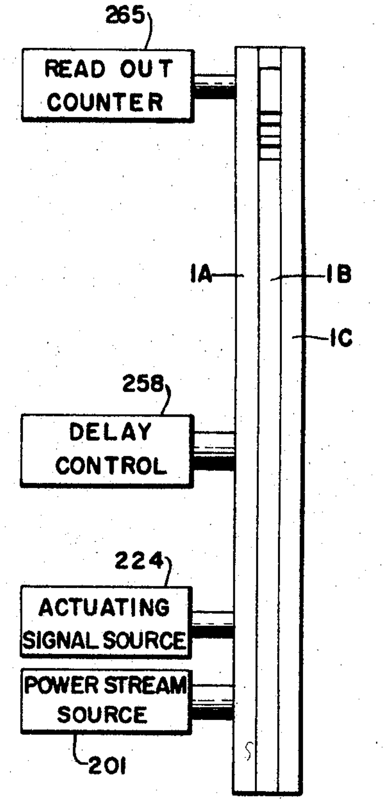
FIG. 9 is a side view of the device of FIG. 8.

FIGS. 8 and 9 illustrate an embodiment of the invention capable of generating a number of fluid digital pulses proportional to the magnitude of an analog input signal.

The analog to digital converter is generally designated 200 and is constructed of three plates 1A, 1B, and 1C in the same manner as the previous embodiments. A power stream source 201 is connected to discharge a power stream jet through power stream nozzle 206 and power stream orifice 207. The power stream is injected into interaction chamber 208 which has a first discharge conduit 210, a second discharge conduit 212, and a third discharge conduit 214 for discharging fluid therefrom. The power stream normally flows out channel 214 due to the well known boundary layer principle since the axis of the power stream nozzle 206 is closer to the right hand wall 216 of interaction chamber 208 than it is to the left hand wall 218 of chamber 208. An actuating signal control nozzle 220 has an orifice 222 located in wall 216 and is connected to an actuating signal source 224. Actuation of signal source 224 causes a control jet to impinge upon the power stream jet and switch the power stream jet to flow out channel 212. During this switching movement the power stream jet crosses the first channel 210 so as to cause a pulse to be injected therethrough. Channel 214 at its downstream end connects with the input of a delay means 226. The output from delay means 226 is injected into channel 228 which, at its downstream end, has an orifice 230 in an inhibit circuit 231.

The output from channel 210 is fed into a manifold channel 232 and is then divided into four parallel channels 234, 236, 238, and 240. The downstream end of each of channels 234, 236, 238, and 240 respectively lead into parallel delay means D2, D4, D6, and D8. The delay means D2, D4, D6, and D8 respectively lead into discharge conduits 242, 244, 246, and 248 all of which are connected to a single signal input channel 250 which terminates at control orifice 251 of the inhibit circuit means 231. Each of the delay means is of different magnitude and in the preferred embodiment delay means D2 has a delay period of 2 time units; delay means D4 has a delay period of 4 time units; delay means D6 has a delay period of 6 time units and delay means D8 has a delay period of 8 time units.

Channel 212 is connected to a variable time delay means 254 having a signal inhibit channel 256 connected to its discharge side. Channel 256 at its downstream end has an orifice 257 in inhibit circuit 231. Variable time delay means 254 may be of any conventional structure wherein the time required for an input pulse signal to exit therefrom may be continuously selectively varied. One conventional manner of doing this is to vary the volume of the delay means as by means of a piston slidable in a cylinder connected to the delay means. A delay control means 258 serves to vary the delay period of means 254 in any conventional manner.

The inhibit circuit means 231 is of the same general type as that illustrated in the previous embodiments but differs in that it has two control input orifices 230 and 257 connected to two signal inhibit channels 228 and 256 for deflecting a signal injected through orifice 251 into an inhibit output or exhaust channel 260. If either of channels 228 or 256 has flow therein and an input pulse is injected through orifice 251 into interaction chamber 262 the input signal is deflected into inhibit output or exhaust channel 260 by the flow from the orifice ends of channels 228 or 256. In the same manner if flow is through both signal inhibit channels 228 and 256, any input signal through orifice 251 will similarly be deflected into channel 260. If neither channel 228 or 256 is actuated an input signal through orifice 251 is directed into signal output channel 264 to be read by the readout counter 265.

The readout counter 265 may be any conventional fluid readout means capable of counting input signals.

In operation, the analog to digital converter 200 is capable of producing from 0 to 4 output pulses to be counted as determined by an analog input to delay control means 258.

Assuming that converter 200 is in its stable state, there is continuous flow through channel 214, delay means 226, channel 228 and orifice 230 the inhibit circuit means 231. Actuation of the actuating signal source 224 produces a control jet which is injected through nozzle 220 and orifice 222 to deflect the power stream jet across channel 210 into channel 212. The switching of the power stream jet across channel 210 causes a pulse to be injected into channel 210 and manifold 232. This pulse is then injected into parallel delay means D2, D4, D6, and D8 but due to their varying delay characteristics four distinct pulses are emitted from the delay means D2, D4, D6, and D8. Consequently, four different pulses are injected into channel 250 so that a first series of four distinct pulses are injected into the inhibit circuit 231 by means of control orifice 251. However, the delay means 226 has a delay period of greater duration than the greatest duration of any of the delay means D2, D4, D6, or D8. In the illustrated embodiment the delay means D8 has the longest delay period of any of the delay means receiving a signal from channel 210 and this delay period consists of 8 time units and the delay period of delay means 226 is 9 time units. Consequently, flow will continue through channel 228 for 9 time units after flow has ceased in channel 214 and since the last output signal from control orifice 251 will occur 8 time units after flow has ceased in channel 214 it is obvious that all four impulses created when the power stream swings from channel 214 across channel 210 to channel 212 are deflected into exhaust channel 260.

The actuating signal through orifice 222 must be of sufficient duration to enable flow from channel 228 to terminate before the actuating signal is terminated for reasons to become apparent from the following discussion.

When flow has been established in channel 212 by control nozzle 220, termination of the input from control nozzle 220 switches the power stream back across channel 210 into channel 214. The switching back movement causes a second series of four pulses to issue from control orifice 251 in the same manner as occurred when the power stream was switched from channel 214 to channel 212. If the variable delay means 254 is adjusted so that it has a delay period less than the shortest delay period of any of delay means D2, D4, D6, and D8, there will be no flow through channel 256 during the time the second series of pulses are injected from control orifice 251 and the readout counter will detect all four of the second series of pulses. However, when the variable time delay means 254 is adjusted so that the time of delay is equal to, or greater than, any of the parallel delay means, flow issues from channel 256 into inhibit circuit 231 at the same time that some of the pulses are received from orifice 251 and a range of from 1 to 4 of the pulses from orifice 251 are deflected to exhaust channel 260. By varying the time delay period of means 254 the number of pulses from orifice 251 which are deflected to exhaust 260 is varied and consequently the number of pulses injected into channel 260 to be read by the readout means is likewise varied.

Figure 10:
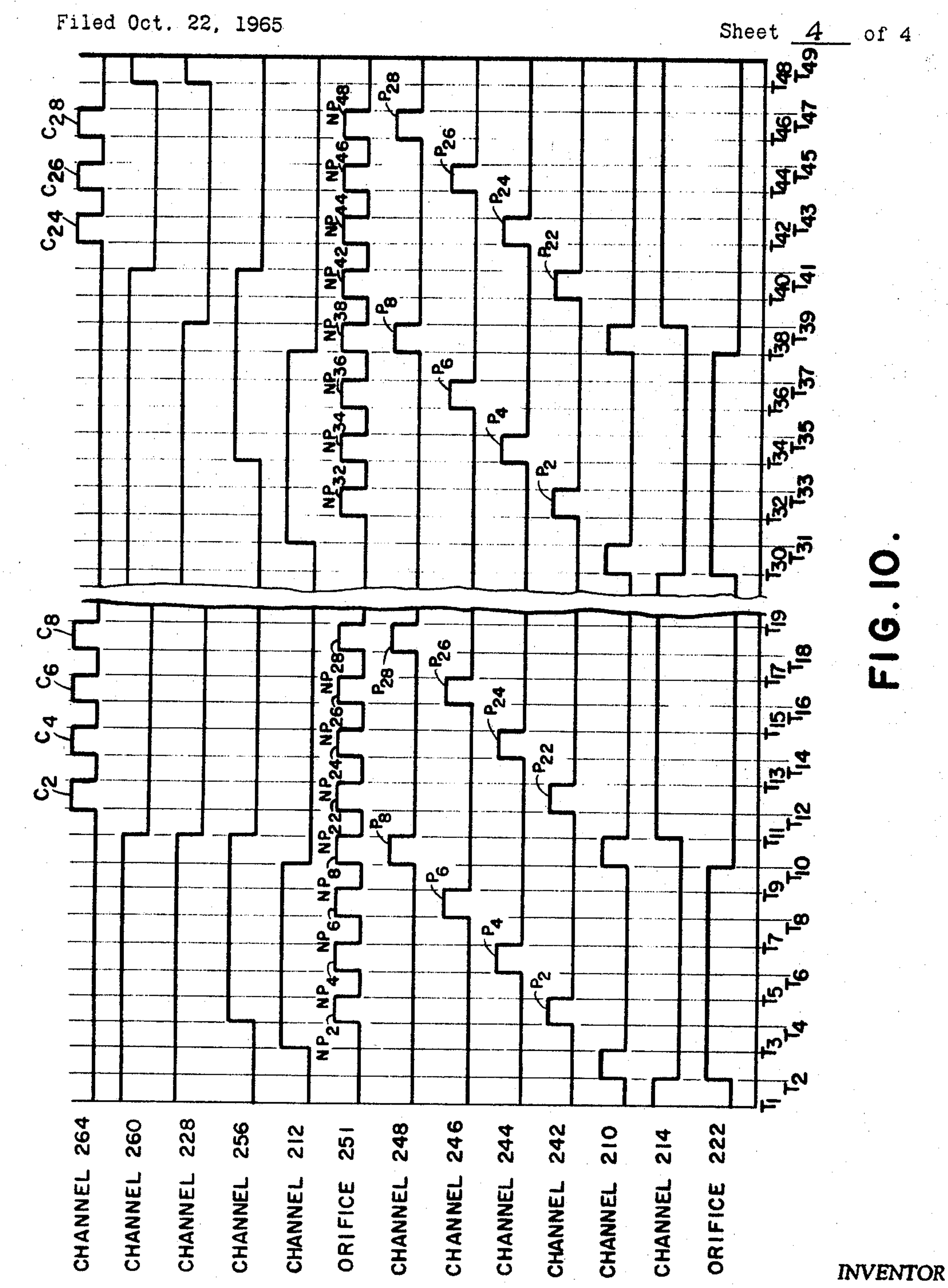
FIG. 10 is a timing chart illustrating the operation of the embodiment of FIG. 8.

The manner in which variation of the time delay period of delay means 254 varies the number of output pulses read by readout means 265 will be best understood by reference to the timing chart illustrated in FIG. 10 of the drawings. Keeping in mind the fact that parallel delay means D2, D4, D6, and D8 have time delay periods of 2, 4, 6, and 8 time units respectively and delay means 226 has a time delay period of 9 time units, assume that delay control means 258 is adjusted so that variable time delay means 254 has a time delay period of 1 time unit. Assuming at time $T_1$ the converter is in its stable or reset state, the power stream flow issues into channel 214. At time $T_2$ actuation of the actuating signal source 224 causes a control jet to issue from nozzle 226 and orifice 222 to begin to swing the power stream toward channel 212. Flow into channel 214 immediately terminates at time $T_2$ and a pulse is simultaneously begun in channel 210. However, due to the nine time unit delay period of delay means 226, fluid will continue to flow through channel 228 and orifice 230 until $T_{11}$. The pulse through channel 210 is fed into manifold 232 and from there to the parallel delay means. The first delay means D2 having a time delay period of 2 time units, produces an output pulse $P_2$ two time units after the beginning of the pulse into channel 210. Accordingly, it will be seen that pulse $P_2$ begins at time $T_4$. In a similar manner delay means D4 creates a pulse $P_4$ in its exhaust channel 244 at time $T_6$ which is four time units after the beginning of the pulse into channel 210. Similarly, delay means D6 and D8 produce pulses $P_6$ and $P_8$ into their respective exhaust channels 246 and 248 at times $T_8$ and $T_{10}$, respectively. Each of the pulses $P_2$, $P_4$, $P_6$, and $P_8$ produces a corresponding simultaneous pulse from orifice 251. The pulses from orifice 251 occur at the same time as the pulses from the parallel delay means since there is substantially no delay between the delay means and orifice 251. The pulses from orifice 251 are designated $NP_2$, $NP_4$, $NP_6$, and $NP_8$ to correspond with the pulses $P_n$ which produce them. Accordingly, it is obvious that actuation of the signal source 224 and control nozzle 220 swings the power stream from channel 214 to channel 212 and produces a first series of pulses from orifice 251 which are designated $NP_2$, $NP_4$, $NP_6$, and $NP_8$. The last nozzle port pulse $NP_8$ terminates at time $T_{11}$. Since flow through channel 228 continues until time $T_{11}$, by virtue of the delay characteristics of delay means 226, all of the impulses $NP_2$ through $NP_8$ are deflected to exhaust channel 260 and there is no flow from channel 264 to readout means 265. The actuating signal through nozzle 220 is terminated at time $T_{10}$ and a second pulse begins in channel 210 at the same time. Simultaneously with the termination of the input from nozzle 220 flow ceases to enter channel 212. Pulses $P_{22}$, $P_{24}$, $P_{26}$, and $P_{28}$ are created in channels 242, 244, 246, and 248 by the parallel delay means at times $T_{12}$, $T_{14}$, $T_{16}$ and $T_{18}$, respectively as determined by the delay characteristics of each of the parallel delay means. Pulses $NP_{22}$ through $NP_{28}$ are created simultaneously with the pulses $P_{22}$ through $P_{28}$. Flow through channel 256 terminates 1 time unit after the termination of the pulse from nozzle 220 since delay means 254 has a delay period of only 1 time unit. Consequently, there is no flow through channel 228 or channel 256 at the time when nozzle pulses $NP_{22}$ through $NP_{24}$ occur in orifice 251 and 4 count pulses $C_2$, $C_4$, $C_6$, and $C_8$ will be injected into channel 264 to be read by the readout counter 265.

After a substantial time period has elapsed as indicated by the broken lines bisecting FIG. 10, assume that the analog input to delay control means 258 has changed so that the variable time delay means 254 has a time delay characteristic of 3 time units. Actuation of the actuating signal source 224 at time $T_{30}$ switches the power stream from channel 214 to channel 212 and creates a pulse in channel 210 at time $T_{30}$. In the same manner as in the last example a first series of 4 pulses $P_2$ through $P_8$ are created in channels 242, 244, 246, and 248, respectively, at times $T_{32}$, $T_{34}$, $T_{36}$, and $T_{38}$, respectively. The pulses $P_2$ through $P_8$ simultaneously create pulses in orifice 251 which are deflected to exhaust channel 260 by continuing flow from channel 228 in the same manner as in the first example. Note that the first series of pulses $NP_2$ through $NP_8$ created during the swing of the power stream from channel 214 to channel 212 are always deflected to the exhaust channel 260 since there is always flow in channel 228 when the first four pulses occur. Upon termination of the control signal from nozzle 220 at time $T_{38}$ flow into channel 212 immediately ceases. However, delay means 254 has a delay period of 3 time units and flow through channel 256 continues until time $T_{41}$. Since there is flow from either channel 256 or channel 228, or from both of said channels, during the time interval from $T_{30}$ to $T_{41}$, all pulses from orifice 251 occuring during this time interval will be deflected out exhaust channel 260. Consequently, impulses $NP_{32}$, $NP_{34}$, $NP_{36}$, $NP_{38}$, and $NP_{42}$ will all be deflected to exhaust channel 260 and there will be no readout from the readout means 265. However, there is no output through either of channels 256 or 228 between time periods $T_{41}$ and $T_{48}$ and consequently, the last three pulses, $NP_{44}$, $NP_{46}$, and $NP_{48}$ will enter channel 264 to form pulses $C_{22}$, $C_{24}$, and $C_{26}$ to be read by the readout means 265.

Consequently, it is obvious that variation of the time delay period of the variable time delay means 254 varies the time during which flow occurs in channel 256 so as to vary the number pulses allowed to enter channel 264. If, for example, variable time delay means 254 should have a value of 5 time units delay, only pulses $NP_{46}$ and $NP_{48}$ would be allowed to enter channel 264 to be read by the readout means. In a like manner if the variable time delay means 254 should have a value of 9 time units, no pulses would be allowed to enter channel 264 to be read by the readout counter 265. Since the first four pulses for each readout cycle are always deflected through exhaust channel 260, it is obvious that variation of the variable time delay means 254 enables a readout of five distinct signals consisting of one pulse, two pulses, three pulses, four pulses or no pulses from orifice 251. Obviously, the number of readout signals possible could be varied by the simple expedient of varying the number of parallel delay means D.

While the analog to digital converter illustrated in FIGS. 8 and 9 would be of use in a large number of devices, one exemplary use would be in a milling machine wherein it would be useful to provide a record of the successive positions of a cutting tool. In order to provide such a record the cutting tool would be connected to the delay control means 258 so that various position of the cutting tool would vary the time delay characteristics of the variable time delay means 254 and actuation of signal source 224 at desired times would provide a digital coding of the position of the cutting means at the desired readout times.

In the embodiment of FIG. 8, the output signals represent the position of the delay control at the time the control pulse at nozzle 220 terminates. Those skilled in the art will readily recognize that by biasing the power stream so that it normally locks onto wall 218, and by moving the control nozzle to the opposite side of the power stream, a converter may be obtained which produces a number of output signals indicative of the position of the delay control at the time the control pulse is initiated.

All embodiments have herein been described in connection with positive flow of fluid under pressure from the control nozzles of the amplifiers. It is well known that as an obvious modification negative pressures or suction may be employed in which case the nozzles must be moved to the opposing sides of the power streams.

Obviously many other modifications and variations of the present invention are possible in the light of the above teachings. It is therefore, to be understood that within the scope of the appended claims, the invention may be practiced otherwise than as specifically described. The embodiments of the invention in which an exclusive property or privilege is claimed are defined as follows:

1. A fluid pulse generator comprising: a pure fluid amplifier having first, second and third output channels intersecting at their upstream extent to form a fluid chamber and a power stream input nozzle for injecting a power stream into said chamber; pure fluid inhibit means comprising a signal input channel and an inhibit input channel, a signal output channel for receiving fluid when a fluid signal is applied to said signal input channel but not said inhibit input channel, and an inhibit output channel for receiving fluid when a fluid signal is applied to said inhibit input channel; means connecting said first output channel of said fluid amplifier to said signal input channel; fluid signal delay means connecting said second output channel of said fluid amplifier to said inhibit input channel; and control means for selectively switching a power stream issuing from said power stream input nozzle between said second and third output channels, the upstream extent of said first output channel being disposed between said second and third output channels whereby said power stream flows into said first output channel for a short interval of time each time it is switched.

2. A fluid pulse generator as claimed in claim 1 wherein said fluid amplifier is a single-side stable fluid amplifier, an injected power stream normally flowing through said chamber to said second output channel in the absence of control signals, said control means comprising a source of fluid control signals and means for applying said control signals to said fluid chamber to control the direction of flow of said power stream.

3. A fluid pulse generator as claimed in claim 1 wherein said fluid amplifier is a bistable fluid amplifier having a set state defined by power stream flow into said second output channel and a reset state defined by power stream flow into said third output channel said control means comprising first nozzle means to which fluid control signals may be applied to switch said amplifier from said set state to said reset state and second nozzle means to which further fluid control signals may be applied to switch said amplifier from said reset state to said set state.

4. A fluid pulse generator as claimed in claim 1 wherein said fluid amplifier is a single-side stable fluid amplifier, an injected power stream normally flowing through said chamber to said third output channel in the absence of control signals, said control means comprising a source of fluid control signals and means for applying said control signals to said fluid chamber to control the direction of flow of said power stream.

5. A fluid pulse generator as claimed in claim 4 wherein said source of fluid control signals comprises means for intermittently producing fluid control signals each having a duration at least as great as the time delay of said delay means.

6. A fluid pulse generator comprising: a pure fluid amplifier having first, second and third output channels intersecting at their upstream extent to form a fluid chamber and a power stream input nozzle for injecting a power stream into said chamber; pure fluid inhibit means comprising a signal input channel and an inhibit input channel, a signal output channel for receiving fluid when a fluid signal is applied to said signal input channel but not said inhibit input channel, and an inhibit output channel for receiving fluid when a fluid signal is applied to said inhibit input channel; means connecting said first output channel of said fluid amplifier to said signal input channel; fluid signal delay means connecting said second output channel of said fluid amplifier to said inhibit input channel; and control means for selectively switching a power stream issuing from said power stream input nozzle between said second and third output channels, the upstream extent of said first output channel being disposed between said second and third output channels whereby said power stream flows into said first output channel for a short interval of time each time it is switched, said means connecting said first output channel of said fluid amplifier to said signal input channel of said inhibit means comprises a plurality of parallel signal conducting paths each of said paths including delay means for delaying a fluid signal applied thereto for a predetermined interval of time, said interval being different for each of said paths, whereby flow of said power stream into said first output channel causes a plurality of discrete signals to be applied to said signal input channel; and delay control means for controlling the fluid signal delay means connected between said second output channel and said inhibit channel whereby the number of signals reaching said signal output channel is determined by said delay control means.

7. A fluid pulse generator as claimed in claim 6 wherein said pure fluid inhibit means comprises a further inhibit input channel positioned such that fluid issuing therefrom causes fluid signals applied to said signal input channel to be directed toward said inhibit output channel; and a fluid channel connecting said third output channel to said further inhibit input channel.

8. A fluid pulse generator comprising: a pure fluid amplifier having first, second, and third output channel means intersecting at their upstream extent, a power stream input, and control means for selectively switching said power stream so that it flows into said second or said third output channel means, said first output channel means being disposed between said second and third output channel means at their upstream extent whereby power stream fluid flows into said first channel means each time said power stream is switched from one of said second and third output channel means to the other; a fluid inhibit circuit having signal input and inhibit input means, a signal output means for receiving a fluid signal applied to said signal input means when no signal is applied to said inhibit input means, and inhibit output means for receiving a fluid signal applied to said signal input means concurrently with the application of a signal to said inhibit input means; selectively variable fluid signal delay means for connecting said second output channel means to said inhibit input means; and means comprising a plurality of parallel paths, each having a different fixed amount of fluid signal delay associated therewith, connecting said first output channel means to said signal input means whereby a plurality of fluid signals may be applied to said signal input means when said power stream is switched.

9. A fluid pulse generator as claimed in claim 8 and further comprising means for varying said variable signal delay means between a lower limit which is less than the shortest of said fixed signal delays and an upper limit which is at least as great as the longest of said fixed signal delays.

10. A fluid pulse generator as claimed in claim 9 and further comprising means defining a path for fluid flow between said third output channel means and said inhibit input means, said path defining means including means for delaying a fluid signal for a time at least as great as the longest of said fixed signal delays.

(References on following page)

References Cited

UNITED STATES PATENTS

| | | | |
|---|---|---|---|
| 3,107,850 | 10/1963 | Warren et al. | 137—81.5 |
| 3,117,593 | 1/1964 | Sowers | 137—81.5 XR |
| 3,159,169 | 12/1964 | Reader | 137—81.5 |
| 3,175,569 | 3/1965 | Sowers | 137—81.5 |
| 3,223,324 | 12/1965 | Franklin | 235—201 |
| 3,238,959 | 3/1966 | Bowles | 137—81.5 |
| 3,266,509 | 8/1966 | Bauer | 137—81.5 |
| 3,266,510 | 8/1966 | Wadey | 137—81.5 |

SAMUEL SCOTT, *Primary Examiner.*